United States Patent [19]

Kuriyama et al.

[11] Patent Number: 4,811,155
[45] Date of Patent: Mar. 7, 1989

[54] PROTECTION CIRCUIT FOR A SEMICONDUCTOR INTEGRATED CIRCUIT HAVING BIPOLAR TRANSISTORS

[75] Inventors: Hirotada Kuriyama; Tomohisa Wada; Shuuji Murakami, all of Hyogo, Japan

[73] Assignee: Mitsubishi Denki Kabushiki Kaisha, Tokyo, Japan

[21] Appl. No.: 142,558

[22] Filed: Jan. 11, 1988

[30] Foreign Application Priority Data

Jan. 10, 1987 [JP] Japan .................................. 62-3712

[51] Int. Cl.$^4$ .............................................. H01L 27/02
[52] U.S. Cl. ........................................ 361/56; 361/58; 361/91; 361/111; 357/23.13; 357/42
[58] Field of Search .................. 361/56, 58, 90–92, 361/86, 100, 110, 111; 357/23.13, 24, 13, 42, 43

[56] References Cited

U.S. PATENT DOCUMENTS 4,476,476 10/1984 Yaet et al. ...................... 357/13 X
4,617,482 10/1986 Matsuda ........................... 361/91

FOREIGN PATENT DOCUMENTS 59-198762 11/1984 Japan .
60-85551 5/1985 Japan .

Primary Examiner—A. D. Pellinen
Assistant Examiner—Todd E. DeBoer
Attorney, Agent, or Firm—Lowe, Price, LeBlanc, Becker & Shur

[57] ABSTRACT

Two resistors are connected in series between an input bonding electrode and an internal circuit, and respective conducting terminals of a first bipolar transistor are connected between the two resistors and a GND bonding electrode which is connected to the internal circuit. Respective conducting terminals of a second bipolar transistor are connected between the two resistors and a $V_{DD}$ bonding electrode which is connected to the internal circuit. Control terminals of the respective ones of the first and second bipolar transistors are connected to the GND bonding electrode respectively.

8 Claims, 9 Drawing Sheets

PROTECTION CIRCUIT FOR A SEMICONDUCTOR INTEGRATED CIRCUIT HAVING BIPOLAR TRANSISTORS

BACKGROUND OF THE INVENTION

1. Field of the Invention

The present invention relates to a protection circuit for a semiconductor integrated circuit, and more particularly, it relates to a circuit for protecting an integrated circuit against high voltage applied to its input terminal.

2. Description of the Prior Art

In a general MIS semiconductor integrated circuit, an input gate of a MIS transistor is extremely weak against electrostatic destruction, and hence a protection circuit is provided between an external connection terminal and an internal circuit to prevent electrostatic destruction, thereby to protect the internal circuit.

FIG. 1 is a circuit diagram including a conventional protection circuit.

Referring to FIG. 1, an inverter circuit 10 having MIS transistors 10a and 10b as an internal circuit 9 is connected with an input bonding electrode 1, a GND (ground) bonding electrode 2 and a $V_{DD}$ (supply voltage) bonding electrode 3 respectively, and an output voltage $V_O$ is extracted from a junction between the MIS transistors 10a and 10b. A protection circuit 8a is provided between the gates of the MIS transistors 10a and 10b and the input bonding electrode 1. The protection circuit 8a is formed by a protective resistor 4 and a resistor 6 which are connected in series between the input bonding electrode 1 and the internal circuit 9 and an NPN bipolar transistor 7a having a collector which is connected between the protective resistor 4 and the resistor 6 and an emitter and a base which are connected to the GND bonding electrode 2. A parasitic resistance 5a is generated by interconnection thereof between the bipolar transistor 7a and the GND bonding electrode 2.

FIG. 2 is a schematic plan pattern diagram of the bipolar transistor as shown in FIG. 1 and FIG. 3 is a cross sectional view taken along the line III—III in FIG. 2, for typically illustrating wiring etc. Referring to FIGS. 2 and 3, a P-type semiconductor substrate 17 is provided on its major surface with an N+-type active layer 14a and a field oxide film 16, an N+-type active layer 14b, a field oxide film 16, a P+-type active layer 15 and a field oxide film 16 enclosing the same. An input wire 11 is connected to the protective resistor 4 which is connected with the input bonding electrode 1, the N+-type active layer 14a and the resistor 6 which is connected with the internal circuit 9 through contacts 13 respectively. A GND wire 12 is also connected to the N+-type active layer 14b and the P+-type active layer 15 through contacts 13.

The N+-type active layers 14a and 14b, the P-type semiconductor substrate 17 and the P+-type active layer 15 form the NPN bipolar transistor 7a, such that the N+-type active layer 14a serves as the collector, the N+-type active layer 14b serves as the emitter and the P-type semiconductor substrate 17 and the P+-type active layer 15 serve as the base respectively.

FIG. 4 is a circuit diagram for illustrating the performance characteristic of an NPN bipolar transistor, and FIG. 5 illustrates the volt-ampere characteristic of the bipolar transistor as shown in FIG. 4.

Referring to FIGS. 4 and 5, a DC variable power source 19 and an ammeter 18 are connected in series to a closed circuit connecting an emitter and a collector of a bipolar transistor 7, whose base is connected to the emitter side.

As voltage V is gradually raised from 0V, current I rapidly flows when the voltage exceeds 10~12V, although no such current flow is caused if the voltage V is not more than 10~12V. This phenomenon is based on a punch through, breakdown or the like. When the voltage V is lowered to the contrary, the current flow is rapidly stopped at 10V, while the current I rapidly flows when the voltage, being further lowered from 0V, is not more than −0.8V. This phenomenon is based on a current in the forward direction. Voltage values are varied with individual NPN bipolar transistors, which show similar characteristics. As hereinbelow described, the NPN bipolar transistor 7 delivers no current with application of low positive voltage but causes a large current flow when the applied voltage exceeds a prescribed level, while causing a large current flow with application of negative voltage, even if the voltage level is low.

On the basis of the aforementioned performance characteristic of the bipolar transistor 7, description is now made on protective operation of the protection circuit 8a as shown in FIG. 1. The protective resistor 4 is adapted to deliver current to cause a large voltage drop, and the resistor 6 is adapted to delay application of high voltage to the internal circuit 9. When positive high voltage is applied to the input bonding electrode 1, current flows from the input bonding electrode 1, through the protective resistor 4, NPN bipolar transistor 7a, and the parasitic resistor 5a to the GND bonding electrode 2 in the case of FIG. 1. When negative high voltage is applied to the input bonding electrode 1, the current flows in the direction exactly opposite to the case of the positive high voltage. As described above, the current flow lowers the voltage applied to the internal circuit 9 thereby protecting the internal circuit 9 from the electrostatic destruction.

FIG. 6 is a schematic plan view showing exemplary positional relation between components relating to conventional protection circuits.

Referring to FIG. 6, input bonding electrodes 1-1 and 1-2 are located in upper and lower positions to be connected to internal circuits 9-1 and 9-2 through protection circuits 8a-1 and 8a-2, respectively. A $V_{DD}$ bonding electrode 3 is provided in the vicinity of the protection circuit 8a-1 and a GND bonding electrode 2 is provided in the vicinity of the protection circuit 8a-2. The GND bonding electrode 2 is commonly interconnected with the upper and lower protection circuit 8a-1 and 8a-2 through wires generating parasitic resistances 5a-1 and 5a-2 respectively. In such a circuit, the parasitic resistance 5a-1 of the protection circuit 8a-1, being separated from the GND bonding electrode 2, may be larger by about several 1000 times than the parasitic resistance 5a-2 of the protection circuit 8a-2, being close to the GND bonding electrode 2, as the case may be. In this case, the parasitic resistance 5a-1 causes a large voltage drop and a voltage drop by a protective resistor 4 becomes small, whereby the protection circuit 8a-1 is insufficient in ability of extracting high voltage. Thus, the internal circuit 9-1 is lowered in electrostatic destruction resistance.

On the other hand, "Semiconductor Device" in Japanese Patent Laying-Open Gazette No. 85551/1985 discloses technique of discharging electrical charge to a grounding wire by punch through generated on a transistor as a protection circuit when static electricity is applied to an input pad.

Japanese Patent Laying-Open Gazette No. 198762/1984 discloses technique of discharging input excessive voltage to a substrate or the like by a diode before the same is transmitted to a MOSFET.

However, neither literature solves the problem caused by increase in parasitic resistance to be solved by the present invention or suggests a method of solving the problem.

SUMMARY OF THE INVENTION

A principal object of the present invention is to provide a protection circuit for a semiconductor integrated circuit, which can reduce influence by increase in parasitic resistance and improve function for protecting an internal circuit.

In order to attain the aforementioned object, the protection circuit for a semiconductor integrated circuit according to the present invention comprises not only a first bipolar transistor provided between a protective resistor and a grounding terminal, but also a second bipolar transistor provided between the protective resistor and a power supply terminal.

In the protection circuit of such structure, function of extracting high voltage applied to the semiconductor integrated circuit is provided not only in the grounding terminal but also in the power supply terminal, thereby to reduce influence by parasitic resistance generated between the protective resistor and the grounding terminal.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 7:
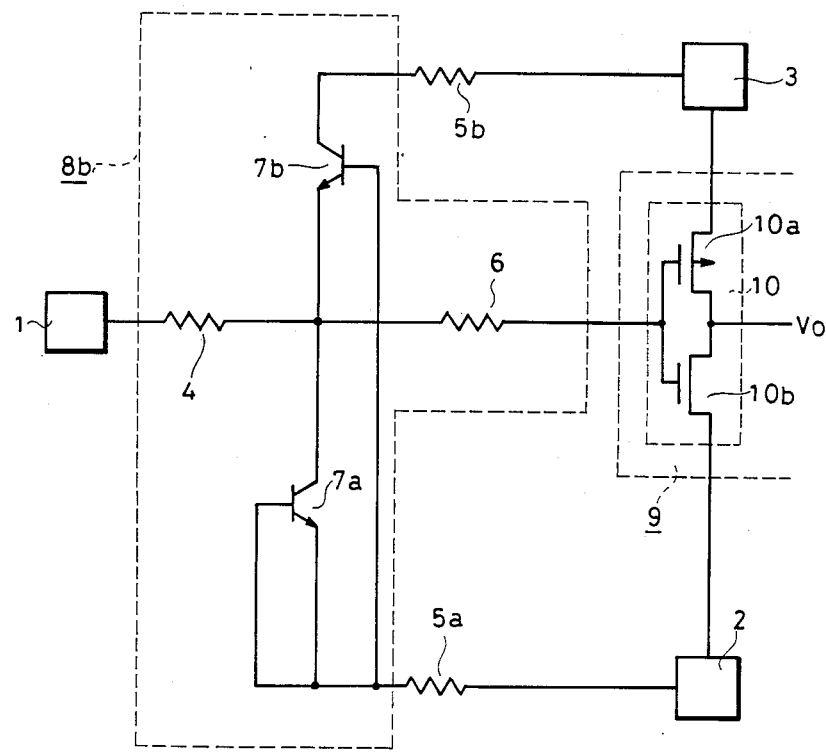
FIG. 7 is a circuit diagram including a protection circuit according to an embodiment of the present invention, in which a bipolar transistor is further provided between a protective resistor and a $V_{DD}$ bonding electrode.

FIG. 7 is a circuit diagram including a protection circuit according to an embodiment of the present invention.

Referring to FIG. 7, an inverter circuit 10 having MIS transistors 10a and 10b as an internal circuit 9 is connected with an input bonding electrode 1, a GND bonding electrode 2 and a $V_{DD}$ bonding electrode 3 respectively, and an output voltage $V_O$ is extracted from a junction between the MIS transistors 10a and 10b. A protection circuit 8b is provided between gates of the MIS transistors 10a and 10b and the input bonding electrode 1. The protection circuit 8b is formed by a protective resistor 4 and a resistor 6 which are connected in series between the input bonding electrode 1 and the internal circuit 9, a first NPN bipolar transistor 7a having a emitter connected between the protective resistor 4 and the collector 6 and an emitter and a base connected to the GND bonding electrode 2 and a second NPN bipolar transistor 7b having an emitter connected beween the protective resistor 4 and the resistor 6, a collector connected to the $V_{DD}$ bonding electrode 3 and a base connected to the GND bonding electrode 2 through resistor 5a. Parasitic resistances 5a and 5b are generated by interconnection between the first bipolar transistor 7a and the GND bonding electrode 2 and between the second bipolar transistor 7b and the $V_{DD}$ bonding electrode 3 respectively.

Figure 8:
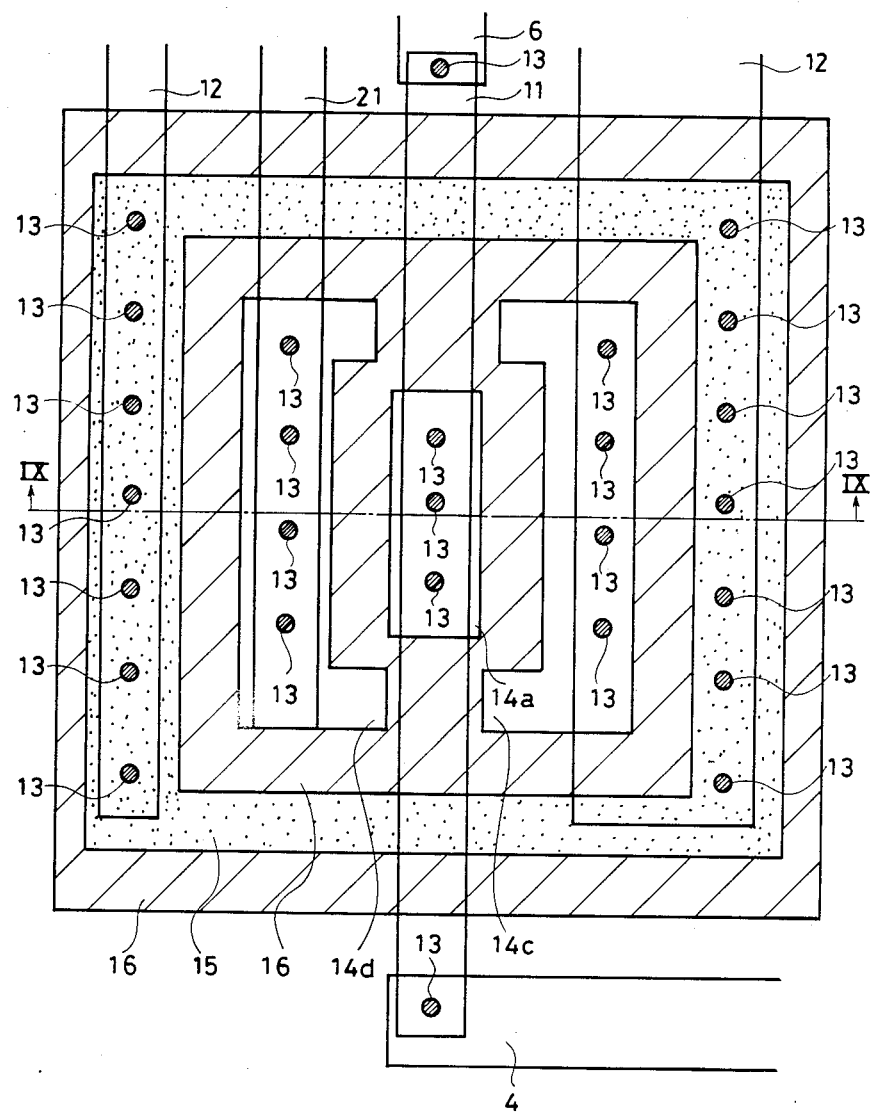
FIG. 8 is a schematic plan pattern diagram of the bipolar transistors as shown in FIG. 7, for illustrating positional relation between collector, emitter and base regions.
Figure 9:
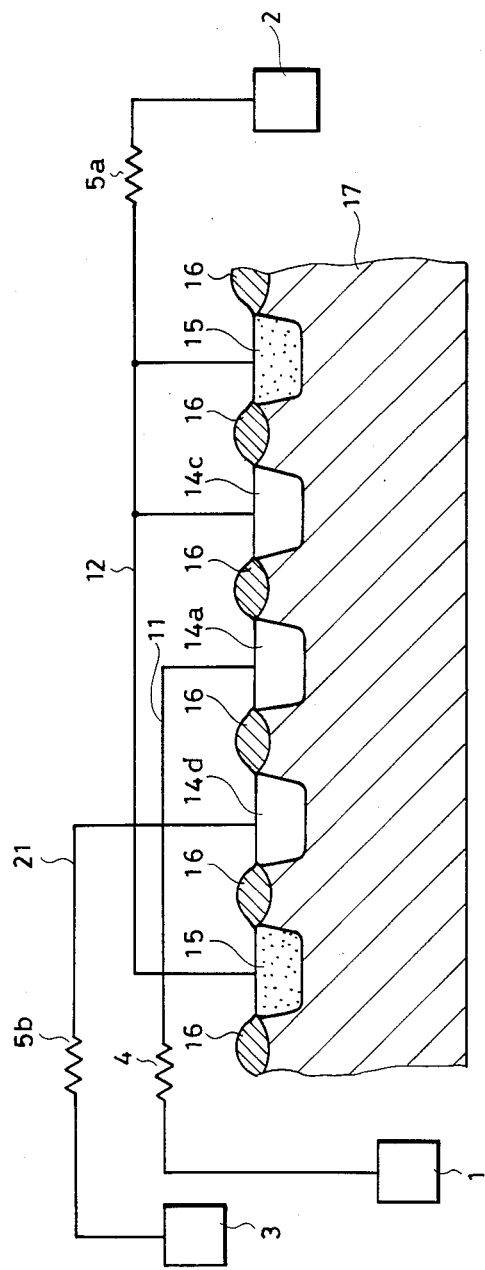
FIG. 9 is a cross sectional view taken along the line IX—IX in FIG. 8, typically illustrating wiring etc.

FIG. 8 is a schematic plan pattern diagram of the bipolar transistors 7a and 7b as shown in FIG. 7, and FIG. 9 is a sectional view taken along the line IX—IX in FIG. 8, typically illustrating wiring etc.

Referring to FIGS. 8 and 9, a P-type semiconductor substrate 17 is provided on its major surface with an N+-type active layer 14a and a field oxide film 16, N+-type active layer 14c and 14d, a field oxide film 16, a P+-type active layer 15 and a field oxide film 16 enclosing the same. The innermost field oxide film 16 is connected with the second field oxide film 16, to insulate/separate the N+-type active layers 14c and 14d from each other. An input wire 11 is connected with the protective resistor 4 which is connected with the input bonding elecrode 1, the N+-type active layer 14a and the resistor 6 which is connected with the internal circuit 9, through contacts 13 respectively. A GND wire 12 is connected to the N+-type active layer 14c and the P+-type active layer 15 through contacts 13, and a $V_{DD}$ wire 21 is connected to the N+-type active layer 14d through contacts 13.

The N+-type active layers 14a and 14c, the P-type semiconductor substrate 17 and the P+-type active layer 15 form a first NPN bipolar transistor, and the N+-type active layers 14a and 14d, the P-type semiconductor substrate 17 and the P+-type active layer 15 form a second NPN bipolar transistor.

Description is now made on the operation. When positive or negative high voltage is applied to the input bonding electrode 1, the high voltage passes through the GND bonding electrode 2 in the same manner as the conventional case. When the applied high voltage is positive, current flows to the $V_{DD}$ bonding electrode 3 from the input bonding electrode 1 through the protective resistor 4, NBN bipolalr transistor 7b, and the parasitic resistor 5b in the case of FIG. 7 due to the breakdown of the NBN bipolar transistor 7b, punch through, or the like. When the high voltage is negative, the current flows in the direction exactly opposite to that in the case of positive high voltage. The above described current flow lowers the voltage applied to the internal circuit 9 thereby protecting the internal circuit 9 from the electrostatic destruction.

As may be obvious from the above description, when the $V_{DD}$ bonding electrode 3 is identical or substantially identical in potential to the GND bonding electrode 2, the current developed in the protective resistor 4 by the high voltage applied to the input bonding electrode 1 is separated into the parasitic resistances 5a and 5b. Namely, the parasitic resistances 5a and 5b form parallel resistance, the total resistance value of which is smaller than the resistance value of the parasitic resistance 5a or 5b. This means that influence by the parasitic resistance 5a, which has been conventionally disadvantageous with respect to the protective resistor 4, is reduced.

Figure 1:
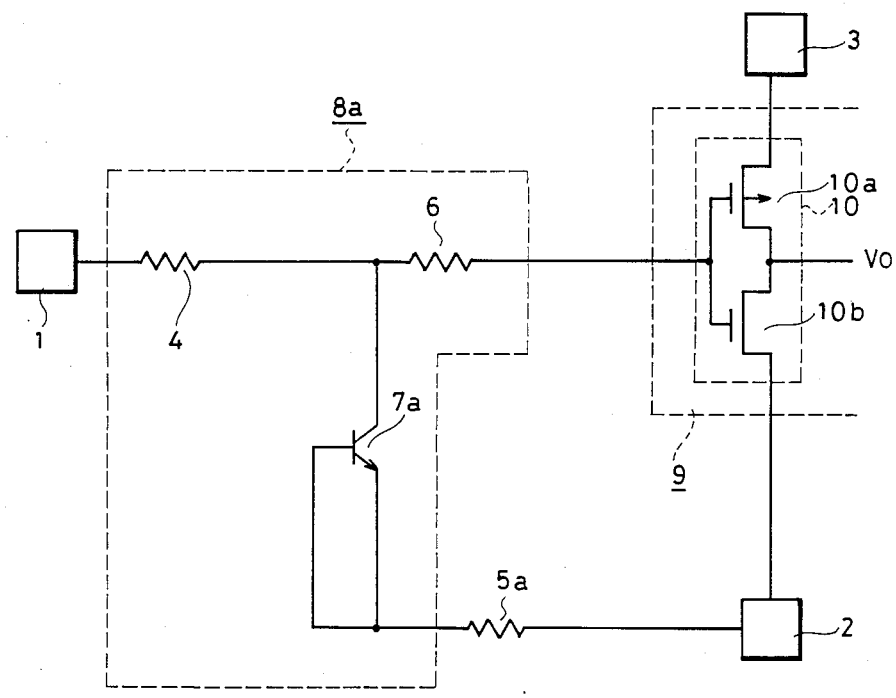
FIG. 1 is a circuit diagram including a conventional protection circuit, in which a bipolar transistor is provided between a protective resistor and a GND bonding electrode.
Figure 2:
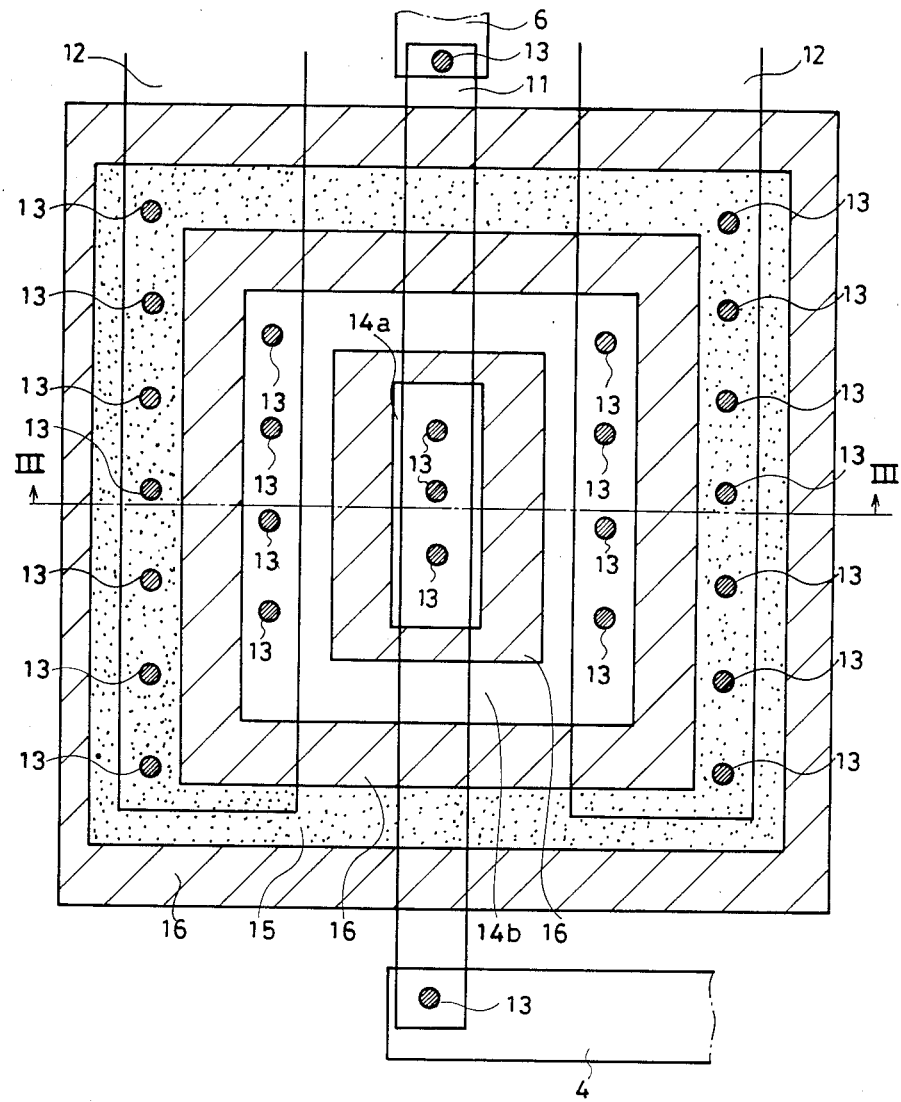
FIG. 2 is a schematic plan pattern diagram of the bipolar transistor as shown in FIG. 1, for illustrating positional relation between collector, emitter and base regions.
Figure 3:
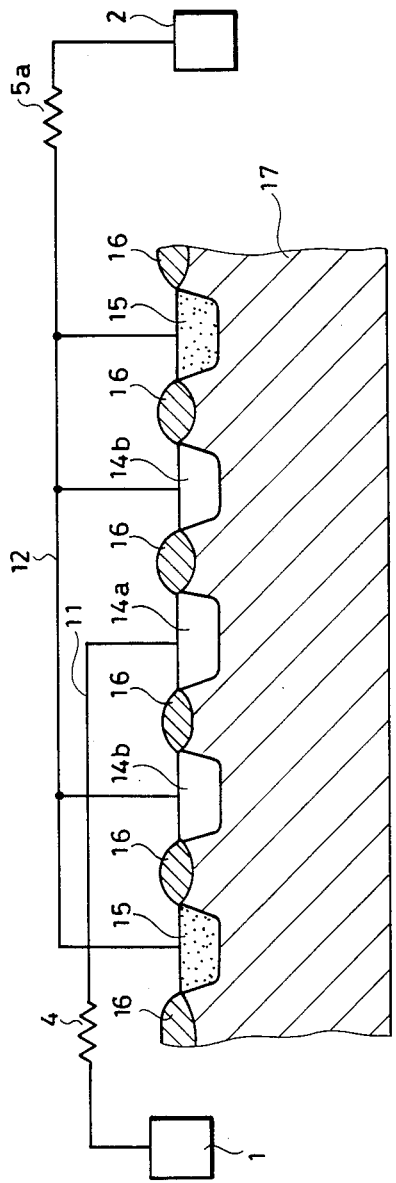
FIG. 3 is a cross sectional view taken along the line III—III in FIG. 2, typically illustrating wiring etc.
Figure 4:
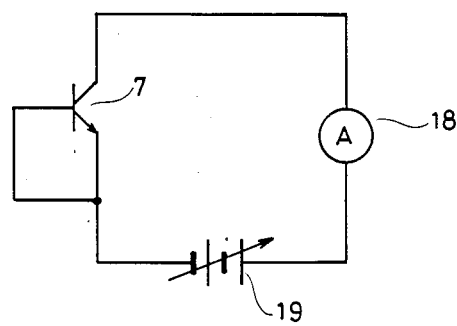
FIG. 4 is a circuit diagram for illustrating the performance characteristic of an NPN bipolar transistor.
Figure 5:
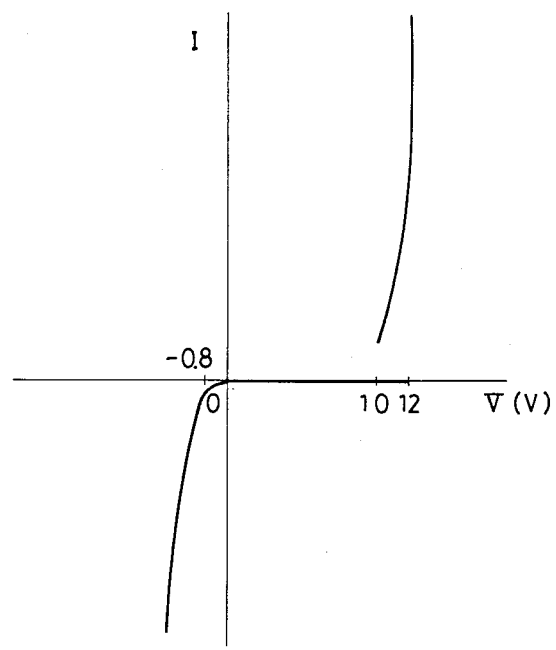
FIG. 5 is illustrative of the volt-ampere characteristic of the bipolar transistor as shown in FIG. 4.
Figure 6:
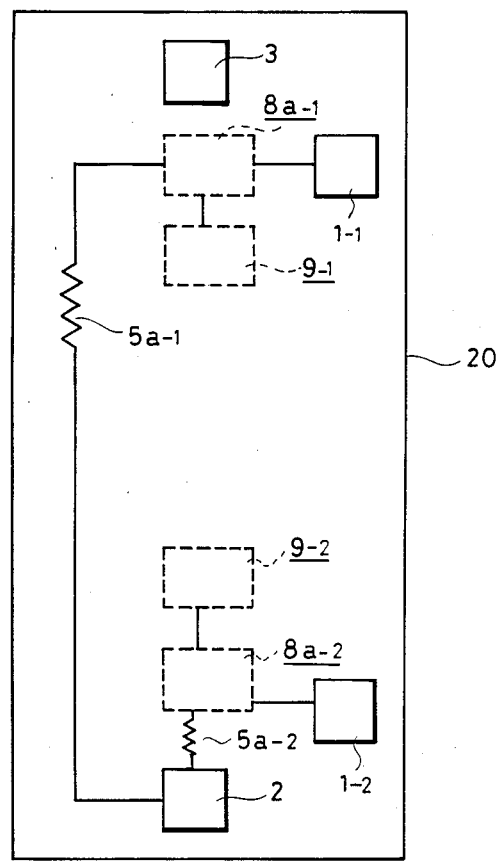
FIG. 6 is a schematic plan view showing exemplary positional relation between components relating to conventional protection circuits, in which one of the protection circuits is located in a position separated from a GND bonding electrode.
Figure 10:
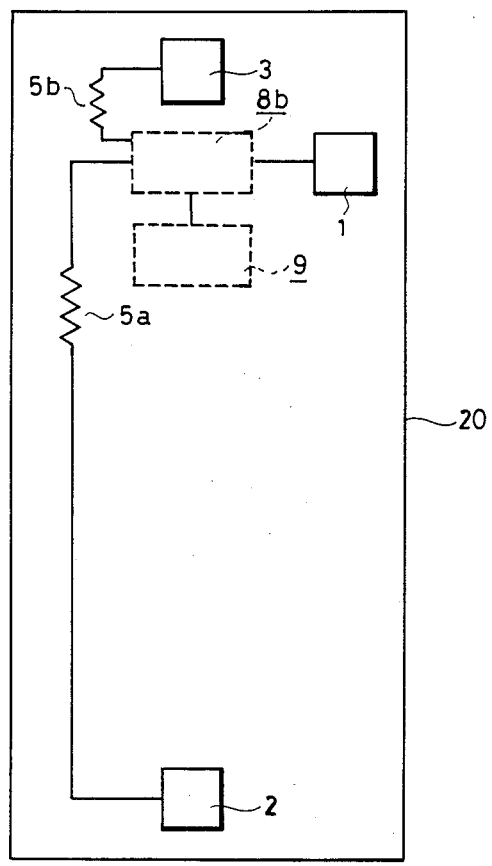
FIG. 10 is a schematic plan view showing exemplary positional relation between components relating to protection circuits according to the embodiment of the present invention, in which a protection circuit separated from a GND bonding electrode is connected with a $V_{DD}$ bonding electrode.

FIG. 10 is a schematic plan view showing an example in which the embodiment of the present invention is applied to the positional relation between the components as shown in FIG. 6.

Referring to FIG. 10, an input bonding electrode 1, a $V_{DD}$ bonding electrode 3 and an internal circuit 9 are connected with each other through a protection circuit 8b in a position separated from a GND bonding electrode 2. Due to such positional relation, a parasitic resistance 5a of a wire connected to the GND bonding electrode 2 from the protection circuit 8b is larger in resistance value than a parasitic resistance 5b of a wire connected to the $V_{DD}$ bonding electrode 3 from the protection circuit 8b. In general, the $V_{DD}$ bonding electrode 3 is thus separated from the GND bonding electrode 2 on an integrated circuit. In this case, therefore, current developed by high voltage applied to the input bonding electrode 1 flows to the $V_{DD}$ bonding electrode 3 mainly through the parasitic resistance 5b. Thus, influence by the parasitic resistance 5a, which has been particularly problematic by such arrangement in the conventional case, is extremely reduced, so that the present invention can contribute to improvement in electrostatic destruction resistance of the internal circuit 9.

Although the gate of the second bipolar transistor is connected to the GND bonding electrode in the above embodiment, the same may be connected to the $V_{DD}$ bonding electrode.

Further, although both of the first and second bipolar transistors are of NPN type in the above embodiment, the same may be of PNP type with respective electrodes thereof being appropriately changed in connection.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit having an input node and connected with a power supply terminal and a grounding terminal, a protection circuit comprising:
    an input terminal
    voltage drop means connected between said input terminal and said input node of said semiconductor integrated circuit for lowering voltage applied to said input terminal to apply the same to said input node of said semiconductor integrated circuit;
    a first bipolar transistor connected between a junction of said voltage drop means and said input node of said semiconductor integrated circuit and said grounding terminal to conduct when the voltage applied to said first bipolar transistor exceeds a prescribed voltage level; and
    a second bipolar transistor connected between said junction and said power supply terminal to conduct when voltage applied to said second bipolar transistor exceeds a prescribed voltage level;
    wherein said first bipolar transistor has a first conducting terminal connected to said junction and a second conducting terminal and a control terminal connected to said grounding terminal respectively; and
    said second bipolar transistor has a first conducting terminal connected to said junction, a second conducting terminal connected to said power supply terminal and a control terminal connected to said grounding terminal.

2. A semiconductor integrated circuit in accordance with claim 1, wherein
    parasitic resistance by connection of said second conducting terminal of said first bipolar transistor and said grounding terminal is larger than parasitic resistance by connection of said second conducting terminal of said second bipolar transistor and said power supply terminal.

3. A semiconductor integrated circuit in accordance with claim 1, wherein
    said first and second bipolar transistors are formed on the same semiconductor substrate.

4. A semiconductor integrated circuit in accordance with claim 1, further including delay means connected between said junction and said input node of said semiconductor integrated circuit to delay application of said voltage lowered by said voltage drop means to said semiconductor integrated circuit.

5. A semiconductor integrated circuit in accordance with claim 4, wherein said delay means in a second resistance element.

6. A semiconductor integrated circuit in accordance with claim 1, wherein said voltage drop means is a first resistance element.

7. A semiconductor integrated circuit having an input terminal and connected with a power supply terminal and a grounding terminal, a protection circuit comprising:
    voltage drop means connected between said input terminal and said semiconductor integrated circuit for lowering voltage applied to said input terminal to apply the same to said semiconductor integrated circuit;
    a first semiconductor control element connected between a junction of said voltage drop means and said semiconductor integrated circuit and said grounding terminal to conduct when said voltage applied to said first semiconductor control element exceeds a prescribed voltage level;
    a second semiconductor control element connected between said junction and said power supply terminal to conduct when voltage applied to said second semiconductor control element exceeds a prescribed voltage level;

said first semiconductor control element comprising a first bipolar transistor having a first conducting terminal connected to said junction and a second conducting terminal and a control terminal connected to said grounding terminal respectively;

said second semiconductor control element comprising a second bipolar transistor having a first conducting terminal connected to said junction, a second conducting terminal connected to said power supply terminal and a control terminal connected to said grounding terminal;

said first and second bipolar transistors being formed on the same semiconductor substrate;

said first and second bipolar transistors being of NPN type.

8. A semiconductor integrated circuit in accordance with claim 7, wherein said first conducting terminal of said first bipolar transistor and said first conducting terminal of said second bipolar transistor are the same impurity region formed on said semiconductor substrate.

* * * * *